United States Patent

Cleeves et al.

(10) Patent No.: US 6,486,066 B2
(45) Date of Patent: Nov. 26, 2002

(54) METHOD OF GENERATING INTEGRATED CIRCUIT FEATURE LAYOUT FOR IMPROVED CHEMICAL MECHANICAL POLISHING

(75) Inventors: James M. Cleeves, Redwood City; Michael A. Vyvoda, Fremont, both of CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/775,761

(22) Filed: Feb. 2, 2001

(65) Prior Publication Data

US 2002/0106837 A1 Aug. 8, 2002

(51) Int. Cl.[7] .................. H01L 21/82; H01L 21/44; H01L 21/4763; H01L 21/302
(52) U.S. Cl. .................. 438/692; 438/129; 438/599; 438/633; 438/926
(58) Field of Search .................. 438/926, 690–693, 438/599, 633, 458–460, 4, 129; 257/773, 776

(56) References Cited

U.S. PATENT DOCUMENTS

| 4,489,478 A | 12/1984 | Sakurai |
| 4,500,905 A | 2/1985 | Shibata |
| 4,711,701 A | 12/1987 | Melevige |
| 4,916,514 A | 4/1990 | Nowak |
| 4,949,162 A | 8/1990 | Tamaki et al. |
| 4,963,501 A | 10/1990 | Ryan et al. |
| 4,973,562 A | 11/1990 | Den Blanken |
| 5,032,890 A | 7/1991 | Ushiku et al. |
| 5,132,237 A | 7/1992 | Matthews |
| 5,278,105 A | 1/1994 | Eden et al. |
| 5,733,798 A | * 3/1998 | Michael et al. ............ 716/19 |
| 5,789,120 A | 8/1998 | Jang et al. |
| 5,885,856 A | 3/1999 | Gilbert et al. |
| 5,981,384 A | * 11/1999 | Juengling .................. 438/666 |
| 6,232,231 B1 | * 5/2001 | Sethuraman et al. ........ 438/691 |
| 6,396,158 B1 | 5/2002 | Travis et al. |

FOREIGN PATENT DOCUMENTS

| EP | 0073486 | 3/1983 |
| EP | 0395886 | 11/1990 |
| JP | 60-119749 | 6/1985 |
| JP | 11-251531 | 9/1999 |

OTHER PUBLICATIONS

Yoichi Akasaka "Three Dimensional Integrated Circuit: Technology and Application Prospect", Microelectronics Journal, vol. 20, No. 1–2, 1989.
Yoichi Akasaka "Three Dimensional IC Trends", Proceedings of the IEEE, vol. 74, No. 12, Dec. 1986.
"Exotic Memories Diverse Approaches" EDN Asia Magazine, Sep. 2001.

* cited by examiner

*Primary Examiner*—Ha Tran Nguyen
(74) *Attorney, Agent, or Firm*—Blakely, Sokoloff, Taylor, & Zafman LLP

(57) ABSTRACT

The present invention is a level of an integrated circuit. The level of integrated circuit has a first area having a plurality of features having a first density and the level of the integrated circuit has a second area adjacent to the first area wherein the second area has a plurality of dummy features having a density substantially similar to the first density.

8 Claims, 5 Drawing Sheets

METHOD OF GENERATING INTEGRATED CIRCUIT FEATURE LAYOUT FOR IMPROVED CHEMICAL MECHANICAL POLISHING

BACKGROUND OF THE INVENTION

1. Field of the Invention

The present invention relates to the field of semiconductor processing and more specifically to a device feature layout and a method of generating the same for improved chemical mechanical polishing.

2. Discussion of Related Art

As device dimensions continue to shrink modern integrated circuits now contain more and more levels of features. For example, modern high density circuits, which can contain literally tens of millions of transistors formed in a silicon monocrystalline substrate, require over six levels of metalization to electrically couple the transistors into functional circuits. Similarly, novel three-dimensional memory arrays such as described in co-pending U.S. patent application Ser. No.: 09/560,626 filed Apr. 28, 2000, and entitled Three-Dimensional Memory Array and Method of Fabrication can utilize over nine levels of silicon rails or lines. As more and more levels of features are added to integrated circuits, the planarization of each level is essential to enable the uniform processing of subsequent levels of features. In the past, dummy features (i.e., electrically isolated inactive features) have been locally inserted between active features of a level in order enhance the chemical mechanical planarization of that level. Unfortunately, however, such techniques of "dummification" (i.e., adding dummy features locally between active features) do not take into consideration the size and density of the active features. Present dummification techniques are useful for providing uniform local planarization, however, they fail to provide mid-range planarity. Lack of mid-range planarity can cause photolithography exposure systems used to form photoresist mask for subsequent layers to print inaccurate images, thereby preventing the formation of additional levels of features.

Thus, what is desired is a method of sizing and locating dummy features in an integrated circuit device level to improve the mid-range planarity of a chemical mechanical polishing process.

SUMMARY OF THE INVENTION

The present invention is directed to a level of an integrated circuit. The level of the integrated circuit has a first area having a plurality of features having a first density and a second area adjacent to the first area wherein the second area has a plurality of dummy features having a density substantially similar to the first density.

In another embodiment of the present invention, a wafer has a plurality of semiconductor integrated circuits separated by a plurality of scribe lines. A plurality of dummy features are formed in the scribe lines.

In yet another embodiment of the present invention, a level of an integrated circuit comprises a core area having a first density of features and a peripheral area having a second density of features, wherein the second density is substantially similar to the first density.

Yet another embodiment of the present invention is directed to a method of generating a layout of an integrated circuit. Accordingly, a first layout of a level of active features is generated wherein, the first layout has a first area and a second area adjacent to the first area wherein the first area has a first density of active features and wherein the second area has a second density of active features. The size of the active features are increased or decreased in the second area so that the density of the active features in the second area is similar to the density of the active features in the first area.

In yet another embodiment of the present invention, an integrated circuit having a plurality of levels of features is provided wherein at least one of said levels of features consists of a plurality of 25 $\mu m^2$ areas having a plurality of features therein, wherein the average density of the features in each of the plurality of 25 $\mu m^2$ areas is substantially similar.

DETAILED DESCRIPTION OF EMBODIMENTS OF THE PRESENT INVENTION

Figure 1A:
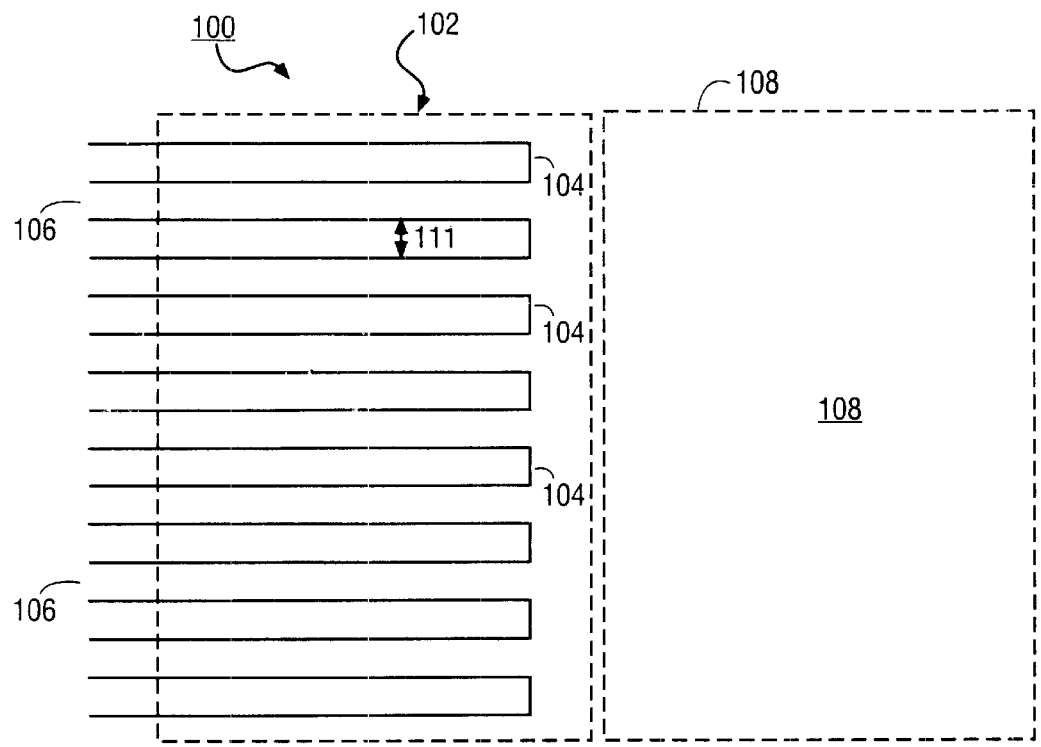
FIG. 1A is an illustration of an overhead view of a portion of an integrated circuit having a plurality of spaced-apart lines or features adjacent to an open area.

The present invention is a novel layout of a layer of an integrated circuit and a method of generating the layout. In the following description numerous specific details are set forth such as specific materials and device layouts. It will be apparent, however, to one skilled in the art that the present invention may be practiced without these specific details. In other instances, well-known circuits and fabrication techniques have not been set forth in detail in order not to unnecessarily obscure the present invention.

According to the present invention, the sizes of active and/or dummy features of a integrated circuit layer or level are chosen and optimized to improve the local and mid-range planarity of a chemical mechanical polishing (CMP) process for the layer. By properly choosing the size and placement of active and dummy features of a layer, a structure can be created which enables the subsequent chemical mechanical polishing of a film formed over and between the structure to have both local and mid-range planarity. The present invention can be used, for example, to improve the chemical mechanical polishing of a gap fill dielectric formed over and around metal or other features and can be used to improve the chemical mechanical polishing of a metal or other conductive film formed over and between a patterned dielectric film, such as in a damascene process. The present invention can also be used to improve the chemical mechanical planarization process of a dielectric film used to fill a trench, such as in a shallow trench isolation (STI) structure. A goal of the present invention is to provide a structure which has a similar density of open areas and covered areas so that the chemical mechanical polishing of a film formed over and between the structure can be made substantially uniform.

Accordingly, an embodiment of the present invention, dummy features are placed in large gaps between active features, and dummy features are sized so that they create a dummy feature to open area density which is similar to the density of adjacent active features. For example, if an active area has 0.25 $\mu$m lines spaced by 0.25 $\mu$m gaps for a 50% density then dummy features would be formed in the adjacent gap with a density of about 50%. In an embodiment of the present invention, dummy features are formed which have substantially the same pitch as well as the same density of the active features. In another embodiment of the present invention, the sizes of the active features in one area are increased or decreased to match the density of active features in an adjacent area.

Additionally, in an embodiment of the present invention, dummy features are placed in scribe lines separating individual integrated circuits or die on a wafer. By placing dummy features in scribe lines, the polishing of the edges of the die can be made more uniform. In yet another embodiment of the present invention, dummy features are added to a device layer and/or active feature sizes are increased or decreased in order to generate a uniform feature density in each 25 $\mu$m$^2$ area of the die.

The above described techniques can be used alone or in combination with one another to enable the uniform local and mid-range planarization of a film formed over and between adjacent features of a level of an integrated circuit or die. Utilizing the above described techniques in each feature level of an integrated circuit enables the formation of an integrated circuit with many layers of active features (e.g., greater than 9 layers). The techniques of the present invention are ideally suited for the formation of an integrated circuit having multiple levels of device features, such as complex logic circuits, and three-dimensional arrays of memory devices, such as antifuse devices as described in co-pending U.S. patent application Ser. No. 09/560,626 filed Apr. 28, 2000, and entitled Three-Dimensional Memory Array and Method of Fabrication and assigned to the present assignee.

FIG. 1A illustrates an overhead view of a portion 100 of a layout of a level or layer of an integrated circuit. Portion 100 includes a first area or region 102 including a plurality of active features 104 separated by gaps 106. Active features are features or structures which are used or are required for the electrical operation or testing of the integrated circuit. Active features include structures or features, such as but not limited to metal interconnects, such as copper or aluminum lines, conductive plugs or vias, gate electrodes, wordlines and bitlines, and semiconductor lines, such as doped silicon that can be used in antifuse memory devices, or other circuit elements such as resistors, capacitors, and diodes that can be used in other three dimensional circuit structures.

Figure 1B:
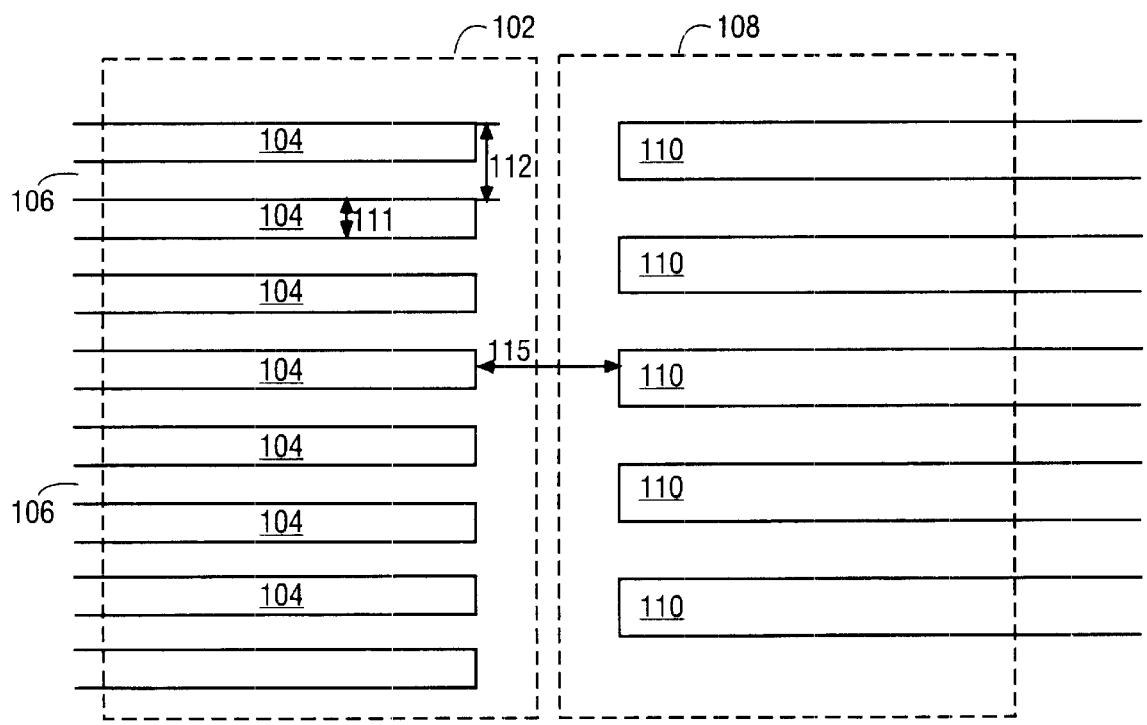
FIG. 1B is an illustration of an overhead view showing the formation of dummy features in the open area of FIG. 1A in accordance with an embodiment of the present invention.

Adjacent to the first area 102 is a second area or region 108 which is an open area where no active features are included. In order to improve the subsequent chemical mechanical planarization process for the layer, dummy features 110 are formed in open area 108 as shown in FIG. 1B. Dummy features are features added to a device layer layout to help improve the uniformity of a chemical mechanical polishing process and are not used in the electrical operation of the integrated circuit. They are typically electrically neutral and isolated features. According to an embodiment of the present invention, as illustrated in FIG. 1B, dummy features are added to the open area 108 with a size and spacing to create an average dummy feature density which closely resembles or matches the density of the active features 104 in an area 102 adjacent to open area 108. That is, according to this embodiment of the present invention, the size, spacing, and density of the dummy features are dependent upon the active feature size, spacing, and density. For example, if region 102 contains a plurality of lines 104 having a 0.25 $\mu$m width 111 and a 0.25 $\mu$m gap 106 separating each line, then the area 102 has a feature density of approximately 50% (i.e., feature density equals total area of features 104 in region 102 divided by total area of region 102). Thus, as shown in FIG. 1B, dummy features are added to open area 108 with a density of approximately 50% so that the dummy feature density in the open area 108 is substantially similar or matches the feature density of 50% in area 102.

It is to be noted, as shown in FIG. 1B, that what is important is to match the dummy feature density to the active feature density and not necessarily to match the exact size (width) and gap spacing of the active features. For example, as shown in FIG. 1B, dummy feature 110 can be formed with a width of, for example, 0.35 $\mu$m and the spacing of 0.35 $\mu$m and still obtain the same feature density as the active features in area 102. The average density of the dummy features should be within ±10% of the active feature density and is preferably between ±3%. Additionally, it is also desirable to add dummy features in a manner so that any 25 $\mu$m$^2$ area of the die has substantially the same density as any other 25 $\mu$m$^2$ area. The dummy features are typically separated from the active features by a gap 115 of approximately 0.25–2.0 $\mu$m to insure that the dummy features do not electrically interfere with the adjacent active features.

Figure 1C:
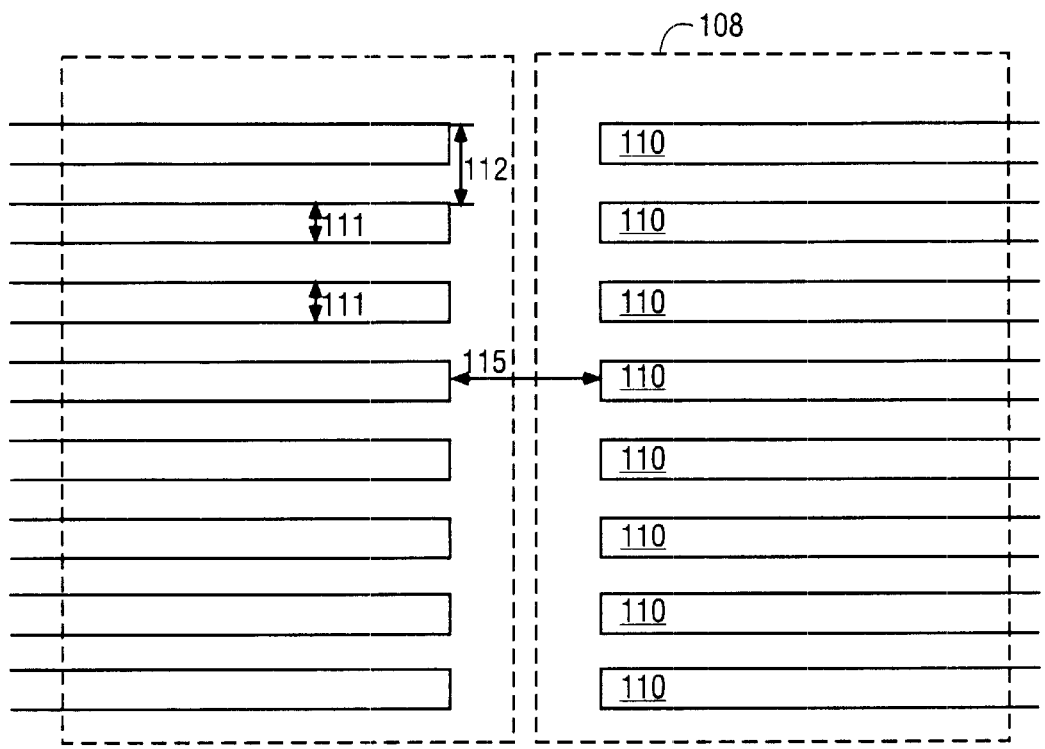
FIG. 1C is an illustration of an overhead view showing the formation of dummy features in the open area of FIG. 1A in accordance with an embodiment of the present invention.

In an embodiment of the present invention, as shown in FIG. 1C, not only are the dummy features 110 added at a density substantially similar to the density of the adjacent active features, but they also are formed with the same shape and spacing as the adjacent active features. For example, if active features are a plurality of parallel lines having a width 111 of 0.25 $\mu$m and a spacing 106 0.25 $\mu$m creating a pitch 112 of 0.5 $\mu$m then the dummy features would be lines having a width of approximately 0.25 $\mu$m and a spacing of approximately 0.25 $\mu$m to create a pitch of 0.5 $\mu$m Accordingly, in an embodiment of the present invention, not only are the dummy features 110 formed to closely resemble the adjacent active feature average density, but they also formed to have substantially the same width 111, spacing 106, and pitch 112 as the active features. In an embodiment of the present invention the width, spacing, and pitch of the dummy features are within 30% of the width, spacing, and pitch of the active features.

In an embodiment of the present invention, not only are the dummy features average density size and spacing dependent upon the adjacent active features average density size and spacing, but the dummy feature density size and spacing are also dependent upon the type film used to fill openings. For example, conformal films, such as a TEOs based $SiO_2$ films form differently over features than for example a non-conformal film such as a high density plasma (HDP) film which tends to form in gaps rather than on features. In an embodiment of the present invention, a HDP oxide is used because it has minimum extra thickness on the top of the lines and features. By minimizing the amount of film on top of the features, the amount of polishing required can be minimized. Additionally, the amount of HDP oxide deposited is kept at a minimum so that non-uniformities in the HDP oxide have the least impact on the overall planarity.

It is to be noted, as is well known in the art, that the layout of a device layer is contained in a database which is operated upon by computer program to create a photolithography mask or reticle for the layer. Accordingly, the dummy features which are added to the active feature layout are incorporated into the active feature database of the layer so that a single mask can be formed which includes both active and dummy features for the device layer. The mask containing dummy features and active features is then used with standard photolithography techniques to pattern a photoresist layer into a photoresist mask having both active and dummy features.

Figure 4A:
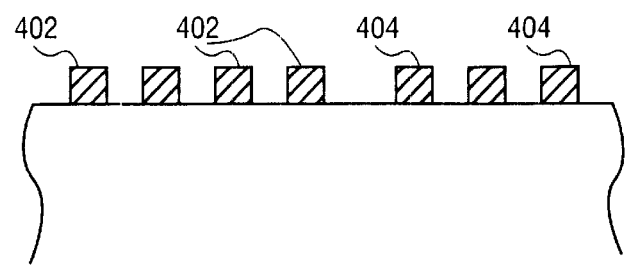
FIG. 4A is an illustration of a cross-sectional view showing the formation of active and dummy features on a substrate.
Figure 4B:
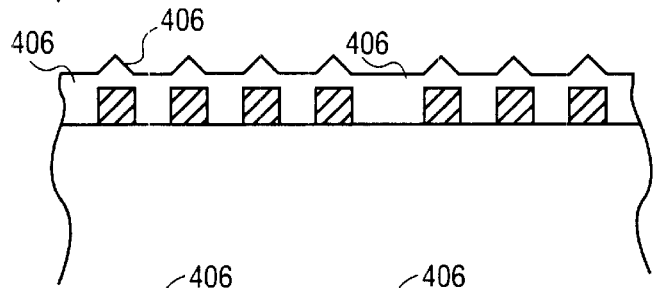
FIG. 4B is an illustration of a cross-sectional view showing the formation of a dielectric over and between the active and dummy features of the substrates of FIG. 4A.
Figure 4C:
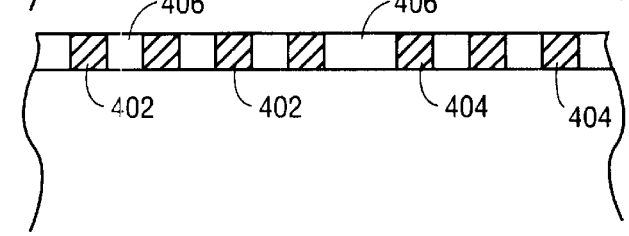
FIG. 4C is an illustration of a cross-sectional view showing the chemical mechanical planarization of the dielectric on the substrate of FIG. 4B.

In a process, such as shown in FIGS. 4A–4C, a dielectric film is formed over and between active features and is then polished back. The photoresist mask is used to pattern, such as by etching, a blanket deposited underlying film, such as a metal or polysilicon film, into the desired active 402 and dummy 404 features for the device layer as shown in FIG. 4A.

Next, a dielectric film, such as an HDP silicon dioxide film, is blanket deposited over and between the active and dummy features to fill the gaps between the features as shown in FIG. 4B. Next, the dielectric film is chemically mechanically polished back until the top of the dielectric film 406 is substantially planar or flat. In an embodiment of the present invention, such as when active feature 402 contain silicon lines used in an antifuse memory device, planarization is continued until dielectric film 406 is completely removed from the top of features 402 and 404 to expose the features and so the dielectric 406 is substantially planar with the top of the active feature 402 and dummy features 404 as shown in FIG. 4C.

Figure 5A:
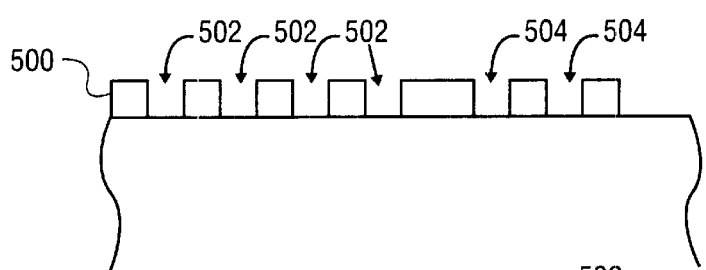
FIG. 5A is an illustration of a cross-sectional view showing the formation of a patterned dielectric layer having active feature openings and dummy feature openings.
Figure 5B:
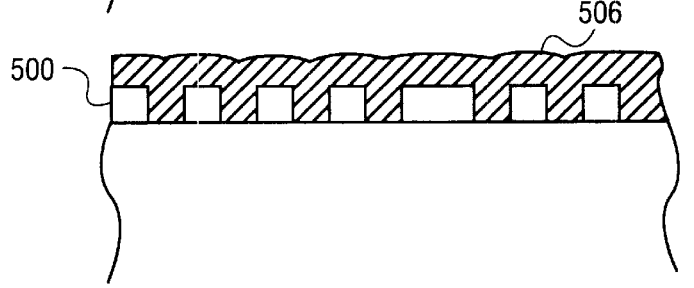
FIG. 5B is an illustration of a cross-sectional view showing the formation of a conductive film over and between the patterned dielectric layer of FIG. 5A.
Figure 5C:
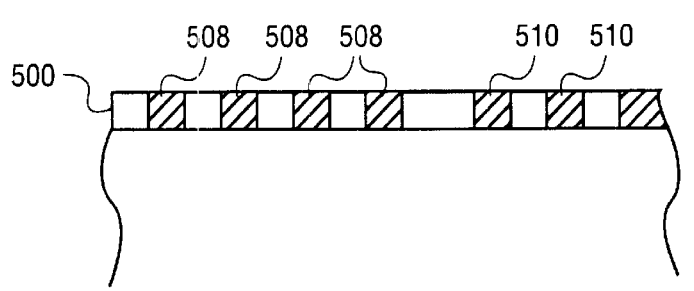
FIG. 5C is an illustration of a cross-sectional view showing the chemical mechanical planarization of the conductive film of the substrate of FIG. 5B to create active and dummy features.

It is to be appreciated that the present invention is not to be limited to a process where a dielectric film is formed between and over metal features and then planarized back, but can also be used in a "damascene" process where a dielectric film is first patterned and then a metal or conductive film blanket is deposited over and between the patterned dielectric film and polished back to form active and dummy features. In a damascene process, as shown in FIGS. 5A–5C, the mask or reticle would be used to form a photoresist mask having openings defining active features and dummy features on a blanket deposited dielectric film 500. The dielectric layer 500 is then patterned, by etching, to create a dielectric layer 500 active feature openings 502 and dummy feature openings 504 where active features and dummy features are desired as shown in FIG. 5A.

Next, a metal or conductive film 506, such as copper, tungsten or aluminum, is blanket deposited, by for example, chemical vapor deposition, sputtering or electroplating into openings 502 and 504 and over patterned dielectric layer 500 as shown in FIG. 5B. Next, the metal film is chemically mechanically polished back to remove the metal film from over the patterned dielectric film 502 and to form active features 508 and dummy features 510 which are planar with the top surface of the patterned dielectric layer 500 as shown in FIG. 5C. By providing dummy feature openings at the same density and preferably at the same size, spacing, and density as the active feature openings, the mid-range uniformity of the polishing of the metal or conductive film used to form the features can be made very uniform. A damascene process is generally used in the fabrication of tungsten plugs or vias and in the fabrication copper interconnects.

Thus, the present invention is equally useful for improving the mid-range and local uniformity for both oxide or dielectric polishing as well as metal polishing in a damascene case.

Figure 2A:
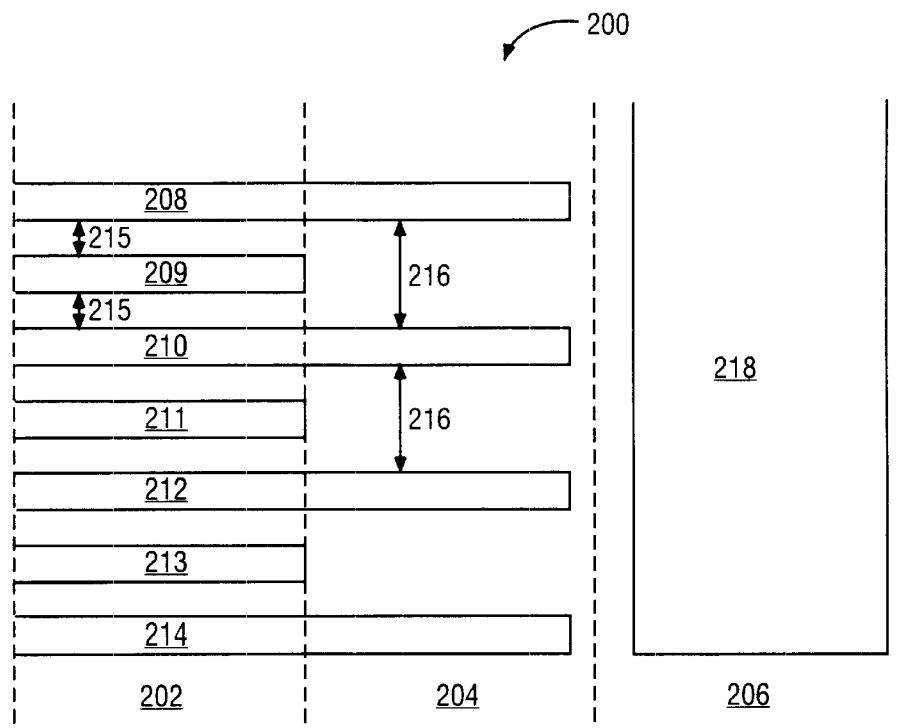
FIG. 2A is an illustration of an overhead view showing the layout of active features having different densities over different areas of an integrated circuit.
Figure 2B:
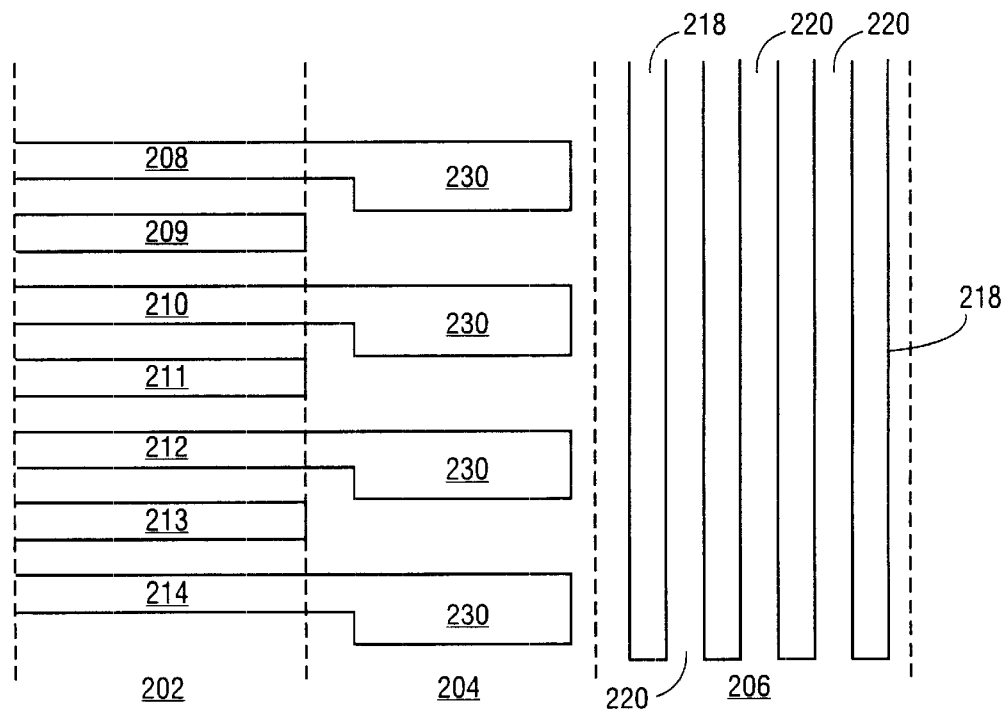
FIG. 2B is an illustration of an overhead view showing the altering of the sizes of the active features shown in FIG. 2A to improve the chemical mechanical planarization process for the layer.

In another embodiment of the present invention, the sizes of the active features are increased or decreased from an original layout in order to generate a uniform device density to improve the mid-range uniformity of a subsequent chemical mechanical planarization process. For example, FIG. 2A illustrates an overhead view of a portion 200 of an integrated circuit having different densities of active features formed in a core area 202, a peripheral area 204, and a bus area 206. Core area 202 includes, for example, active features comprising a plurality of spaced-apart lines or rails 208–214 having a width of approximately 0.25 $\mu$m separated by a 0.25 $\mu$m gap 215. In the peripheral area 204 only some of the lines (208, 210, 212, and 214) are formed in the second area while lines 209, 211, and 213 are not formed or continued into the second area or region 204. Such a layout creates a "fanout" of the lines which can be used, for example, to enable vias to make electrical connections to layers above and below. However, because of the "fanout" of the active features, the density (e.g., 25%) of features in the second region 204 is less than the density (50%) of active features in the first region 202. Similarly, region 206 contains a single wide conductor 218, such as a bus, which has a large feature density (e.g., 75%). Because of the different feature densities of the various regions of the original device layout, subsequent chemical mechanical polishing will suffer from poor global and mid-range planarity. As such, according to this embodiment of the present invention as shown in FIG. 2B, the sizes of the active features are altered from their original layout to generate a new active feature layout which has a similar active feature density in each region 202, 204, and 206. That is, according to this embodiment of the present invention, the size and spacing of active features in one region or area are altered to match the average density of active features in an adjacent region. For example, as shown in FIG. 2B, the ends 230 of lines 208, 210, 212, and 214 are widened, by for example, 0.25 $\mu$m each in order to fill a portion of the large spacing 216 between the lines and thereby create a feature density in area 204 which is substantially similar to the density in area 202. In an embodiment of the present invention, the active features in one area are altered to be within 5% of the average density of active features in the adjacent 25 $\mu m^2$ area.

In a similar manner, the size of wide conductor 218 is reduced in order to decrease the feature density so that it can be made similar to the feature density in regions 202 and 204. For example, wide conductor 218 can be split into a plurality of individual lines 218 which are separated by gaps 220. In this example, wide conductor 218 can be split into a plurality of 0.25 µm lines separated by 0.25 µm gaps to create a 50% density which is similar to the feature density in areas 202 and 204 and which create a feature pitch which is similar to area 202. Thus, according to this embodiment of the present invention, the sizes of the active features are altered (increased or decreased) from the original layout design to improve subsequent chemical mechanical polishing for that device layer without the need of dummy features. Of course, dummy features can be used also, if desired.

In an embodiment of the present invention, dummification and/or active feature alteration is used to create a layer of a semiconductor integrated circuit which contains substantially the same average feature density (active and/or dummy features) in each 25 µm$^2$ area of the layer. In this way, local and mid-range planarity for the entire layer can be obtained. In an embodiment of the present invention, each active feature layer of the integrated circuit has the same density in each 25 µm$^2$ area of the layer thereby enabling the formation of an integrated circuit having an almost limitless of feature layers. It is to be noted that according to this embodiment of the present invention, it is important that each 25 µm$^2$ area of a layer have the same feature density (active and/or dummy feature density) and it is not important that one layer have the same density as another layer. For example, it is allowable to have one layer with one density (e.g., 20%), a second layer with a second density (e.g., 50%) and a third layer with a third density (e.g., 30%).

Figure 3A:
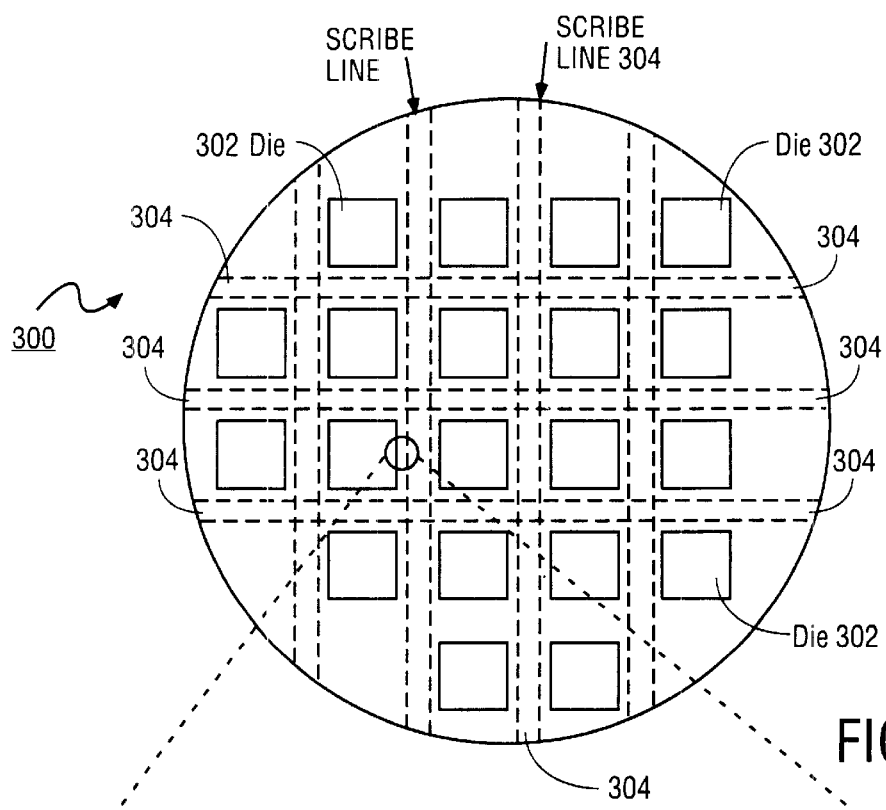
FIG. 3A is an illustration of an overhead view of a wafer having a plurality of discreet dies separated by scribe lines.

In yet another embodiment of the present invention, dummy features are added to the scribe lines between adjacent die or semiconductor integrated circuits formed on a wafer. For example, as shown in FIG. 3A, a semiconductor wafer 300 includes a plurality of discrete integrated circuits (or dies) 302 separated by a plurality of parallel and orthogonal scribe lines 304. The scribe lines 304 are the paths that saw blades take when separating or sawing the wafer 300 into individual die 302. Generally, the scribe lines are void of features because the scribe lines do not form part of the integrated circuit. Test features used to monitor fabrication processes are sometimes formed in parts of the scribe lines.

Figure 3B:
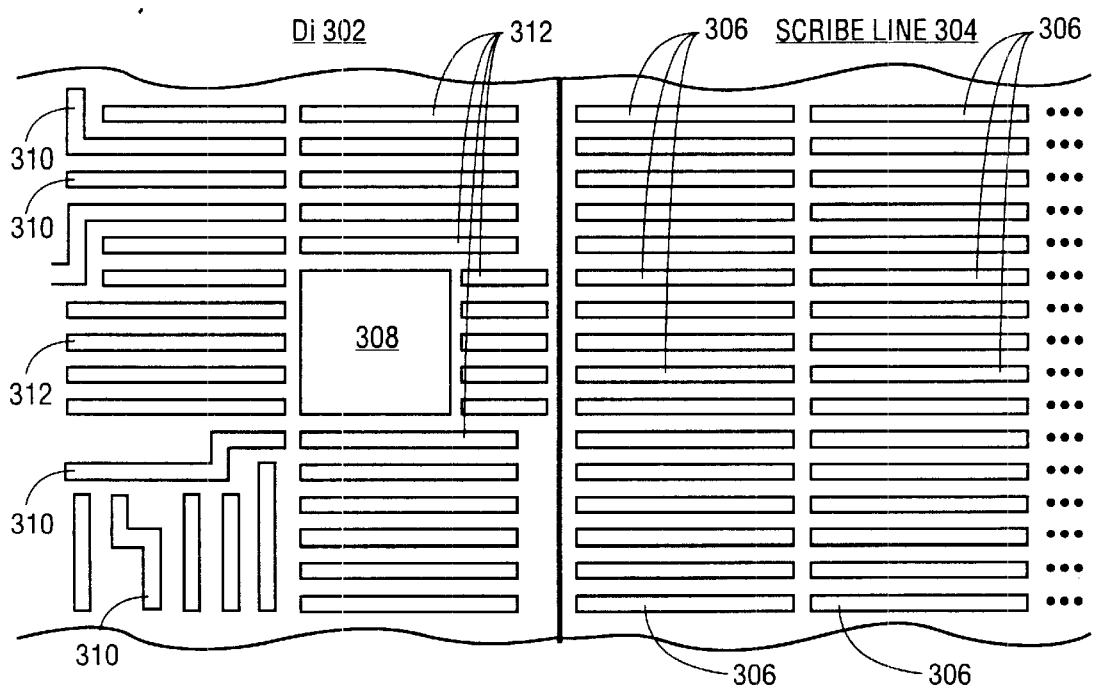
FIG. 3B is an illustration of an overhead view of a portion of the wafer of FIG. 3A showing the formation of dummy features in the scribe lines.

According to this embodiment of the present invention, dummy features 306 are added or located in the scribe lines 304 adjacent to each die 302. FIG. 3B illustrates a portion of wafer 300 showing a portion die 302 and a portion of the adjacent scribe lines 304 having dummy features 306 formed therein. By adding dummy features 306 to the scribe lines adjacent to the die edge, the polishing of the edge of the die can be uniform and similar to the central portion of the die. It is to be appreciated that it is important that the whole stepper field and the transition at the edge of the stepper field are optimized with dummy structures. It is to be noted that the planarization range is short enough that if the scribe lines 304 is not optimized with the dummy features, then the region of the die near the scribe lines will not polish properly. As described above, it is preferable to form dummy features 306 at an average density which is similar to the average density of the features of the die or integrated circuit near the edge of the die and preferably the dummy features are formed at the same size, space, and pitch as the features near the die edge.

Additionally, as shown in FIG. 3B, the present invention places dummy features everywhere on the wafer including scribe lines 304 and in areas adjacent to bond pads 308. FIG. 3B shows the top level of features which include a bond pad 308 and low density active features 310. Dummy features 312 have been added to the layout around the pond pads 308 and low density active features 310 to improve the subsequent chemical mechanical planarization of the layer or level.

Thus, several novel integrated circuit structures and their method of design have been set forth which provide for an improved chemical mechanical polishing process. It is to be appreciated that these techniques can be used alone or in combination with one another to improve the chemical mechanical polishing of a film formed over and between these structures. It is to be appreciated that the present invention has been described with respect to specific embodiments and that the present invention is not to be limited to these specific embodiments. The scope of the present invention is to be determined by the appended claims which follow.

We claim:

1. A method of generating a layout in an integrated circuit comprising:

generating a first layout of a level of active features, said first layout having a first area and a second area adjacent to said first area wherein the first area has a first density of active features and wherein said second area has a second density of active features; and increasing or decreasing the size of said active features in said second area wherein the size of said active features in said second area is increased or decreased to provide an average active feature density which is within 5% of the average density of active features in said first area.

2. The method of claim 1 wherein said first area and said second area have an area of approximately 25 µm$^2$.

3. The method of claim 1 wherein said active features comprise conductive lines or plugs.

4. A method of generating a level of an integrated circuit comprising:

generating a first layout of a level of an integrated circuit having a first area of active features with a first density and a second area of active features with a second density, wherein said first density is greater than said second density;

generating a second layout of said level of said integrated circuits by adding dummy features to said second area to make the average feature density of said features in said second area within ±10% of the average feature density in said first area;

generating a photolithographic mask for said second layout;

using said photolithographic mask to pattern a conductive film into active features and dummy features;

depositing a dielectric film over and between said active features and said dummy features; and chemically mechanically polishing said dielectric film until said dielectric is substantially planar.

5. The method of claim 4 wherein said chemical mechanical polishing is continued until said active and dummy features are exposed.

6. The method of claim 4 wherein in said second layout the average feature density in said second area is within +3% of the average feature density in said first area.

7. A method of generating a level of an integrated circuit comprising:

generating a first layout of a level of an integrated circuit having a first area of active features with a first density and a second area of active features with a second density, wherein said first density is greater than said second density;

generating a second layout of said level of said integrated circuits by adding dummy features to said second area to make the average feature density of said features in said second area within ±10% of the average feature density in said first area;

generating a photolithographic mask from second layout;

using said mask to pattern a dielectric film into a patterned dielectric film having active feature openings and dummy feature openings;

depositing a conductive film over and between said active feature openings and said dummy feature openings; and chemically mechanically polishing said conductive film until said conductive film is substantially planar with the top of said pattern dielectric layer.

8. The method of claim 7 wherein in said second layout the feature density in said second area is within ±3% of the average feature density in said first area.

* * * * *